(12) United States Patent
Vigna et al.

(10) Patent No.: US 6,924,958 B2
(45) Date of Patent: Aug. 2, 2005

(54) READ/WRITE TRANSDUCER FOR HARD DISK DRIVES WITH OPTICAL POSITION MEASURING SYSTEM, AND MANUFACTURING PROCESS THEREOF

(75) Inventors: Benedetto Vigna, Pietrapertosa (IT); Simone Sassolini, Sansepolcro (IT); Sarah Zerbini, Fontanellato (IT); Lorenzo Baldo, Bareggio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 349 days.

(21) Appl. No.: 10/001,922

(22) Filed: Nov. 13, 2001

(65) Prior Publication Data

US 2002/0109931 A1 Aug. 15, 2002

(30) Foreign Application Priority Data

Nov. 14, 2000 (IT) .................................... TO2000A1067

(51) Int. Cl.⁷ ............................................. G11B 5/596
(52) U.S. Cl. ................................ 360/77.03; 360/78.11
(58) Field of Search ............................ 360/77.03, 78.11

(56) References Cited

U.S. PATENT DOCUMENTS

| | | | |
|---|---|---|---|
| 4,079,252 A | | 3/1978 | Brake .......................... 250/237 |
| 4,590,527 A | * | 5/1986 | Warner ...................... 360/78.11 |
| 4,797,866 A | * | 1/1989 | Yoshikawa ................ 369/44.14 |
| 5,227,625 A | * | 7/1993 | Hetzler ................... 250/231.13 |
| 5,325,349 A | * | 6/1994 | Taniguchi ................. 360/77.03 |
| 5,568,337 A | * | 10/1996 | Eguchi et al. ............ 360/78.11 |
| 5,930,066 A | * | 7/1999 | Ishizuka et al. .......... 360/77.03 |
| 5,982,494 A | * | 11/1999 | Hercher ....................... 356/620 |
| 6,583,948 B1 | * | 6/2003 | Taniguchi ..................... 360/75 |

OTHER PUBLICATIONS

Gatzen, H., "Challenges in Machining Ultraprecision Pico Sliders," *Data Storage*, pp. 85–90, Sep. 1997.

* cited by examiner

*Primary Examiner*—David Hudspeth
*Assistant Examiner*—K. Wong
(74) *Attorney, Agent, or Firm*—Lisa K. Jorgenson; Harold H. Bennett, II; Seed IP Law Group PLLC

(57) ABSTRACT

Described herein is a read/write transducer for a hard disk drivewith dual actuation stage, comprising at least one hard disk and at least one suspension carrying the read/write transducer. The read/write transducer comprises a supporting body having a substantially parallelepipedal shape, a read/write head arranged on a front face of the supporting body, and a grating defined on one of the side faces of the supporting body during the process of manufacture of the read/write transducer. The grating enables measurement of the position of the read/write transducer with respect to the corresponding suspension in an optical way using a laser transmitter emitting and directing towards the grating a laser beam, and a laser receiver arranged to intercept the laser beam reflected by the grating and outputting a position signal on the basis of which it is possible to calculate, in a simple way, the position of the read/write transducer with respect to the corresponding suspension.

53 Claims, 5 Drawing Sheets

READ/WRITE TRANSDUCER FOR HARD DISK DRIVES WITH OPTICAL POSITION MEASURING SYSTEM, AND MANUFACTURING PROCESS THEREOF

BACKGROUND OF THE INVENTION

1. Field of the Invention

The present invention relates to a read/write transducer for hard disk drives with dual actuation stage and to the manufacturing process thereof.

2. Description of the Related Art

As is known, hard disk drives are the media most widely used for storing data in personal computers; consequently they are produced in very large volumes and the maximum data storage density increases year by year.

The structure of a known hard disk drive is shown in FIGS. 1–3.

The hard disk drive, designated as a whole by 1, comprises a group of hard disks 2 rotating jointly with and parallel to each other around a rotation axis A and carried by a supporting structure 4 mounted on ball bearings (not shown) and actuated by a synchronous motor (not shown), generally known as "spindle motor."

The hard disk drive 1 further comprises a read/write device 6 for reading/writing the hard disks 2, comprising a supporting structure generally known as "E-block" 8 because of its E-like shape in side view (see FIG. 2), which is angularly mobile around an oscillation axis B parallel to the rotation axis A of the hard disks 2 and is provided with a plurality of arms 10 orthogonal to the oscillation axis B and each carrying one or two suspensions 12, each formed by a steel lamina cantilevered with respect to the corresponding arm 10.

At the end not fixed to the corresponding arm 10, each suspension 12 carries a joint, generally known as "gimbal" or "flexure" 14, also made of steel, holding in turn a read/write transducer generally known as "slider" 16 and arranged, in operating condition, facing onto a surface of a corresponding hard disk 2, as shown in FIG. 2.

As shown in greater detail in FIG. 3, each gimbal 14 is generally formed from the corresponding suspension 12 and is composed, for example, of a rectangular plate 14a cut around on three and a half sides starting from the suspension 12 itself and having a portion 14b connected to the suspension 12 and allowing flexure of the plate 14a under the weight of the slider 16, which is therefore able to perform rolling and pitching movements in order to follow the surface of the corresponding hard disk 2.

Each slider 16 is formed by a supporting body 20 having a generally parallelepipedal shape with typical dimensions 1×1.2×0.3 mm, made of ceramic material, generally an alloy of aluminum, titanium and carbon (Al—Ti—C), and carrying, on its front face, a read/write head 22 (magneto/resistive and inductive) which constitutes the proper reading and writing device. Electrical bonding wires, not shown, extend from the read/write head 22 along the corresponding gimbal 14 and the corresponding suspension 12 to a signal processing device (also not shown) fixed to the mother board of the personal computer or other apparatus in which the hard disk drive is installed.

In the hard disk drives 1 currently on the market, each of the sliders 16 is glued directly onto the corresponding gimbal 14 and the movement of the read/write device 6 across the hard disks 2 is achieved with a motor, generally known as "voice coil motor" 24 (FIG. 1), coupled to the E-block 8 to move it angularly around the oscillation axis B.

After having been subjected to all the surface finishing operations and having been fitted on the E-block 8, and before the final closing of the protective external casing in which the hard disk drive 1 is placed, control information is stored in each of the hard disks 2 in specific so-called pilot traces of specific so-called servo control sectors or servo sectors. During operation, this control information is then read by the sliders 16 and supplied to servo control devices (not shown) which process it to determine the position of the suspensions 12, and therefore of the sliders 16 integral with them, with respect to the corresponding hard disks 2, and to realize a closed loop control of the position of the sliders 16 so as to keep the reading heads 22 in an optimum reading position.

The market demand for a constant increase of the data storage density of hard disk drives 1 leads to an increasingly closer packing of the traces of the hard disks 2 and so the intrinsically poor precision of the voice coil motor 24 does not provide sufficient guarantees for the execution of the initial operation of writing the control information in the pilot traces of the servo sectors of the hard disks 2.

To overcome this inconvenience, an external precision actuation device is currently used, generally known as "spin-stand" 26 (schematically illustrated in FIG. 1), which moves the E-block 8 with micrometric precision, and therefore also the sliders 16 on the corresponding hard disks 2, by means of its own output control shaft 28 coupled to one of the suspensions 12 and provided with an optical encoder (not shown).

Recently, however, to obtain more precise and finer control of the position of the slides 16 with respect to the corresponding hard disks 2, it has been proposed to use a moving device with dual actuation stage, in which a first rougher actuation stage including the voice coil motor 24 which moves the assembly formed by the E-block 8, the suspensions 12, the gimbals 14 and the sliders 16 across the hard disks 2 during the track coarse search, while a second finer actuation stage includes a plurality of integrated microactuators 30 (one of which is shown in FIG. 3) each arranged between a corresponding slider 16 and a corresponding gimbal 14 and having the aim of carrying out a finer regulation of the position of the sliders 16 during the tracking.

An example of an embodiment of a rotary electrostatic microactuator 30 is described in the European patent application number 98830269.1, filed May 5, 1998 in the name of the applicant.

The introduction of a degree of freedom of movement between each slider 16 and the corresponding suspension 12 resulting from the introduction of a microactuator 30 means that, in order to be able to carry out the aforementioned initial operation of writing the control information in the pilot traces of the servo sectors of the hard disks 2 with the spin-stand 26, it is necessary to know, not only the position of the suspensions 12 with respect to the corresponding hard disks 2, but also the position of the sliders 16 with respect to the corresponding suspensions 12.

The determination of the position of a slider 16 with respect to the corresponding suspension 12 could, at least theoretically, be carried out indirectly by determining the position of the microactuator 30, to which the slider 16 is restrained, with respect to the corresponding suspension 12, on the basis of the driving signals supplied to the microactuator 30, or by measuring the capacitive coupling existing between the rotor and the stator of the microactuator 30, since this coupling is correlated to the position of the microactuator 30.

In practice, however, this solution is difficult to put into practice, as the precision of determination of the position of the slider 16 with respect to the suspension 12 which may be obtained with this solution has proven to be insufficient for the execution of the initial operation of writing the control information in the pilot traces of the servo sectors in high data storage density applications in which the distances between the traces of the hard disks 2 are extremely reduced.

In fact, in the hard disk drives 1 with a dual actuation stage moving device of the type described above, the slider 16 is restrained to the corresponding microactuator 30 by gluing and generally the positioning of the slider 16 with respect to the microactuator 30 obtained with this type of connection presents a rather high degree of uncertainty, which has a significant influence on the precision of determination of the position of the slider 16 with respect to the suspension 12, making it insufficient for applications with high data storage density.

BRIEF SUMMARY OF THE INVENTION

An embodiment of the present invention provides a slider for a hard disk drive, a hard disk drive, a system for measuring the position of the slider, and a procedure for manufacturing said slider which allow the determination of the position of the slider with respect to the corresponding suspension with sufficient precision for any application with high data storage density.

According to an embodiment of the present invention, a read/write transducer for a hard disk drive is provided.

According to another embodiment of the present invention, a procedure for manufacturing a read/write transducer for a hard disk drive is further provided.

According to a further embodiment of the present invention, a hard disk drive is moreover provided.

Additionally, according to an embodiment of the present invention, a system for measuring the position of a read/write transducer for a hard disk drive is provided.

A method of operation of a device according to an embodiment of the invention is also provided.

BRIEF DESCRIPTION OF THE SEVERAL VIEWS OF THE DRAWING(S)

For a better understanding of the present invention, a preferred embodiment is now described, purely as an example without limitation, with reference to the enclosed drawings, in which.

Figure 4:
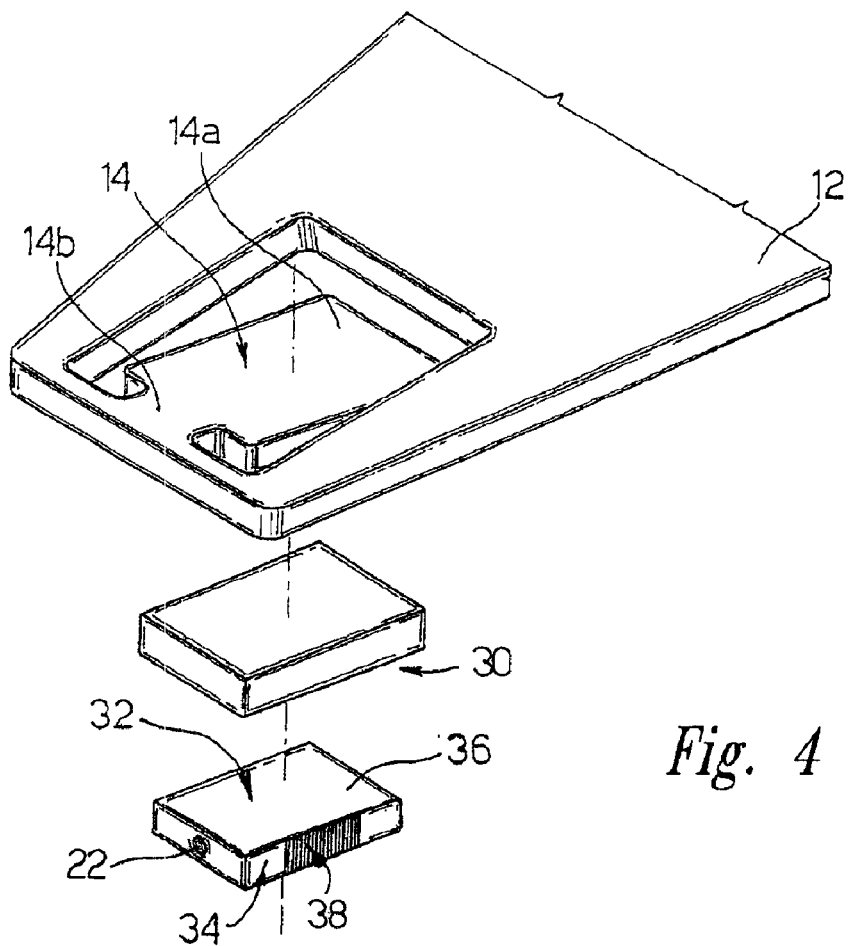
FIG. 4 is a perspective view of a slider according to the present invention.
Figure 12:
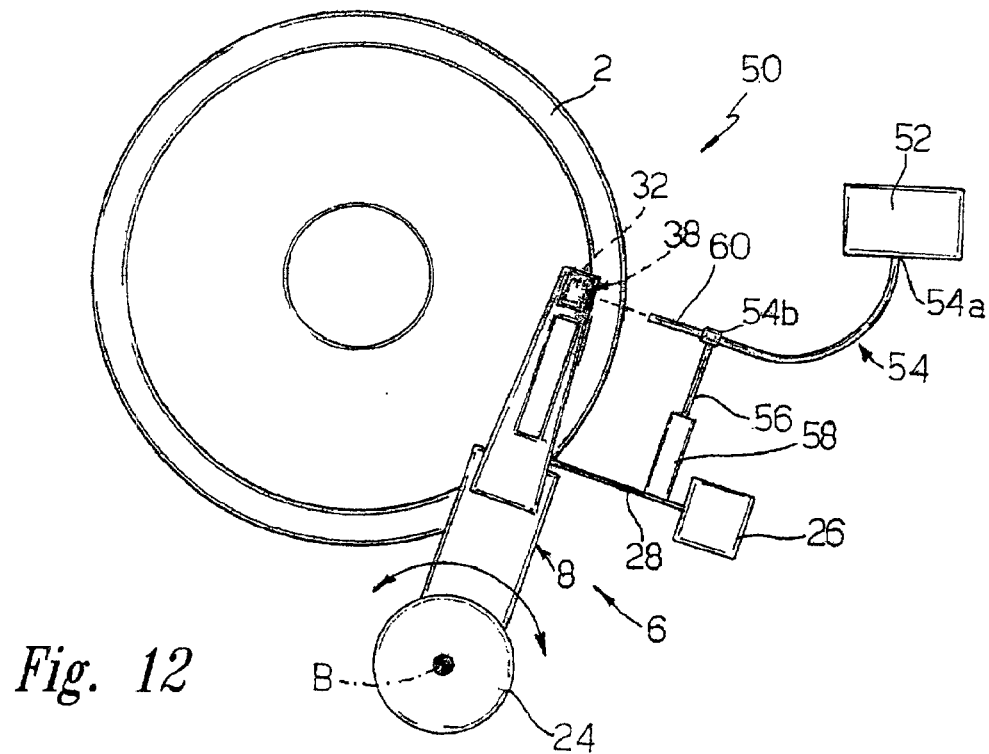
Figure 13:
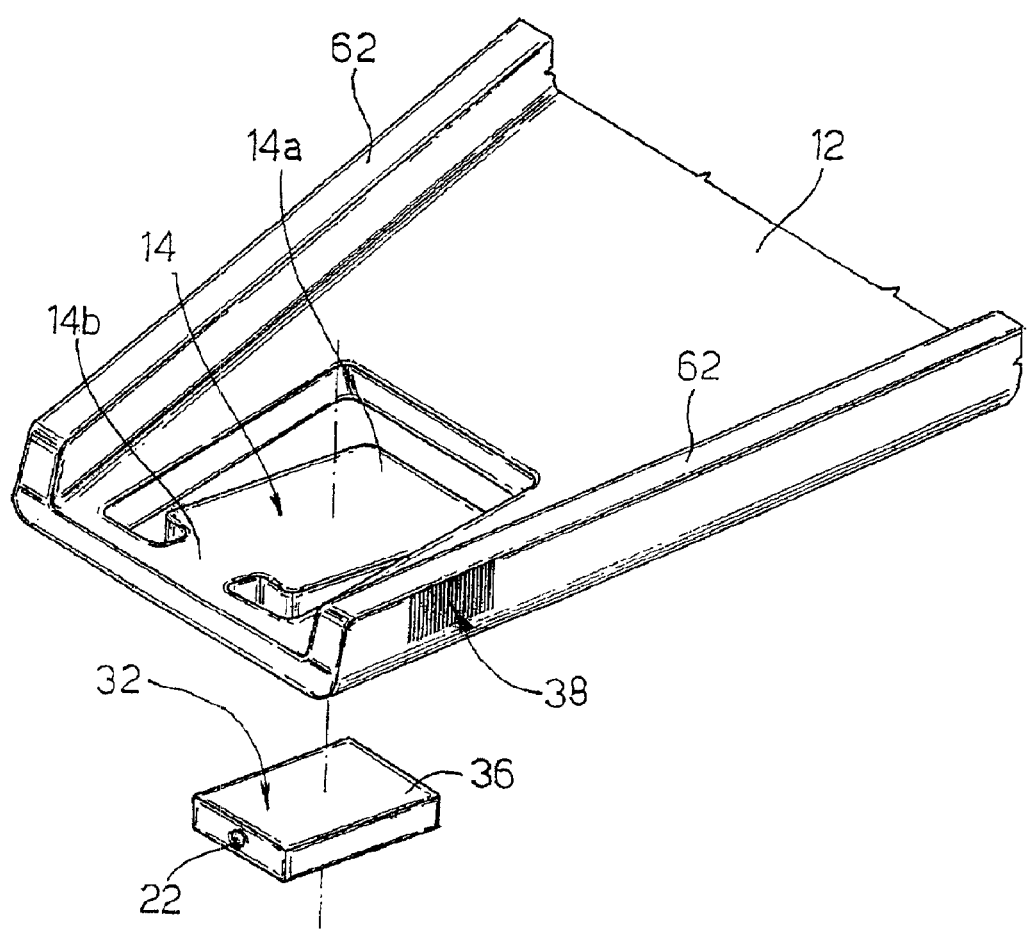

FIG. 12 schematically shows an optical apparatus for measuring the position of the slider in FIG. 4; and FIG. 13 is a perspective view of a different embodiment of the present invention.

DETAILED DESCRIPTION OF THE INVENTION

Figure 1:
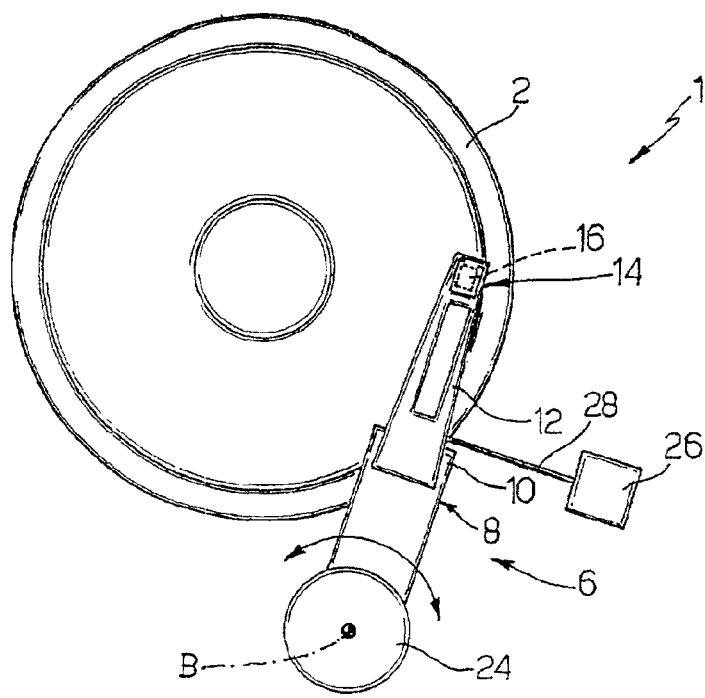
FIG. 1 is a top view of a known hard disk drive.
Figure 2:
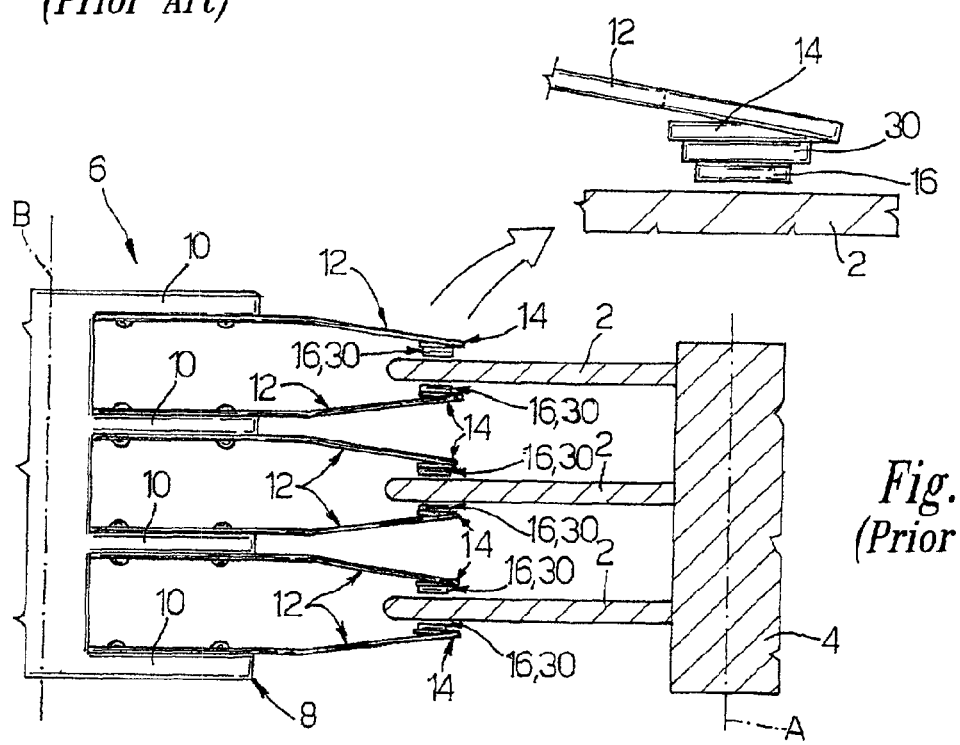
FIG. 2 is an enlarged side view of some parts of the hard disk drive in FIG. 1.
Figure 3:
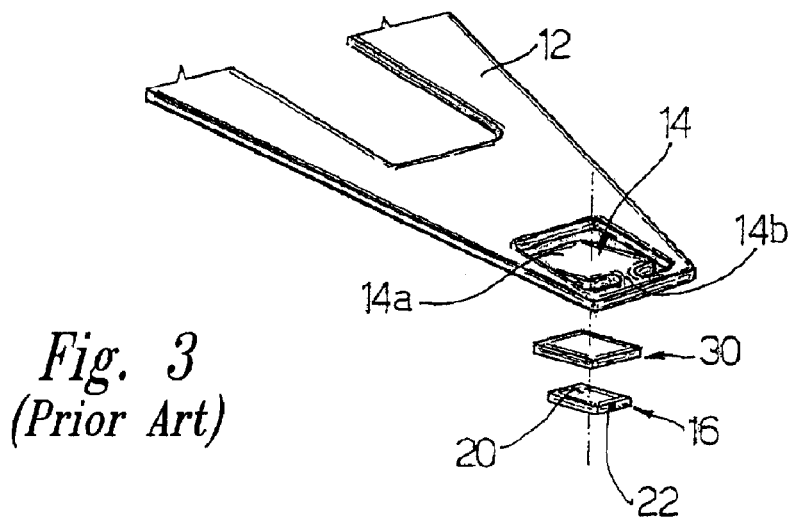
FIG. 3 is an exploded view of a micrometric actuation stage forming part of the hard disk drive in FIG. 1.

FIG. 4 shows a slider, designated as a whole by 32, according to the present invention. For clarity, parts indicated in FIGS. 4–13, which are similar to those in FIGS. 1–3, are indicated with the same reference numbers.

According to an embodiment of the present invention, during the slider manufacturing process, on one of the four side faces, here indicated with 34, of the supporting body, here indicated with 36, of the slider 32, a grating 38 is defined, which, as is known, is an optically detectable structure, periodic in reflection (transmission) and essentially formed by zones that reflect (transmit or refract) an incident electromagnetic radiation (light), alternating with zones that are non-reflective with respect to said incident electromagnetic radiation.

In particular, in its most general form a grating is formed by a pattern of lines or slits preferably parallel to one another, having the same width and spaced at the same interval, and, when impinged by a light beam, it produces fringe effects, in particular it generates a spatially periodic light distribution which appears as a so-called fringe pattern.

The structure and the optical properties of a grating are indeed widely known in the field of optical physics and are dealt with in many publications in the sectors, so they will not be analyzed any further hereinafter.

Figure 5:
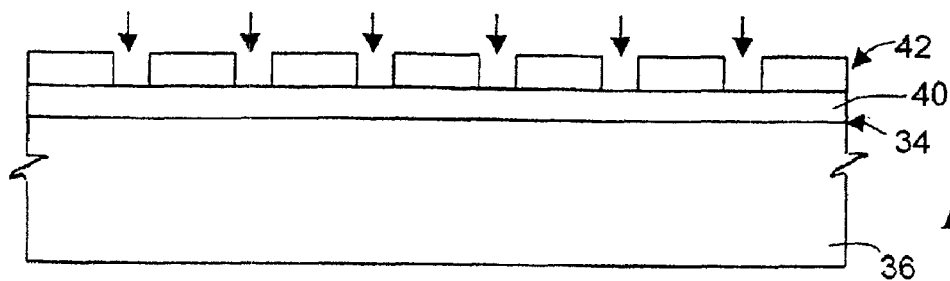
FIGS. 5–7 show steps of a process for manufacturing the slider in FIG. 4.
Figure 6:
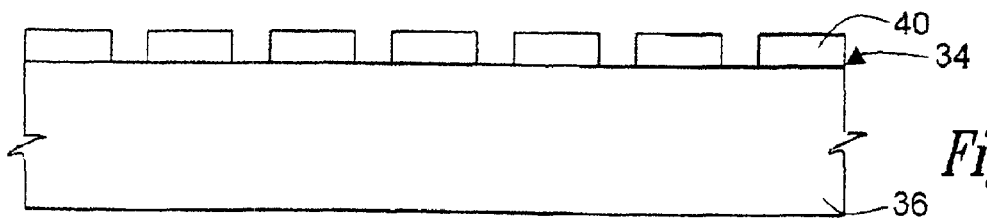
Figure 7:
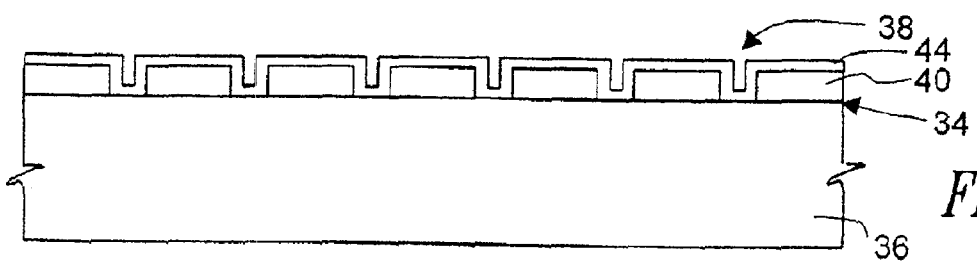

The grating 38 is formed during the slider manufacturing process in the way schematically illustrated in FIGS. 5–7, that is by initially depositing an oxide layer 40 on the side face 34 of the supporting body 36, then defining the oxide layer 40 through a chemical etch using a resist mask 42, later removed, reproducing the pattern of the grating 38, in particular reproducing the arrangement of the reflecting zones and of the non-reflective zones that one wishes to obtain, and finally metallizing (layer 44) the oxide layer 40 thus defined.

In particular, for the metallization of the oxide layer 40, for example, an alloy of aluminum and chrome (Al—Cr) may be used or the same alloy (aluminum, titanium and carbon Al—Ti—C) with which the supporting body 36 of the slider 32 is made.

The portions of the oxide layer 40 removed and not removed define a succession of crests and depressions alternating with one another. The metallized zones deposited at the removed portions of the oxide layer 40 define the non-reflective zones of the grating 38, while the metallized zones deposited at the non removed portions of the oxide layer 40 define the reflecting zones of the grating 38.

Figure 8:
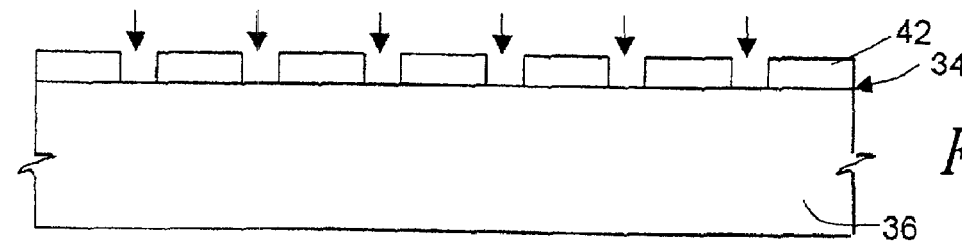
FIGS. 8–10 show steps of a different process for manufacturing the slider in FIG. 4.
Figure 9:
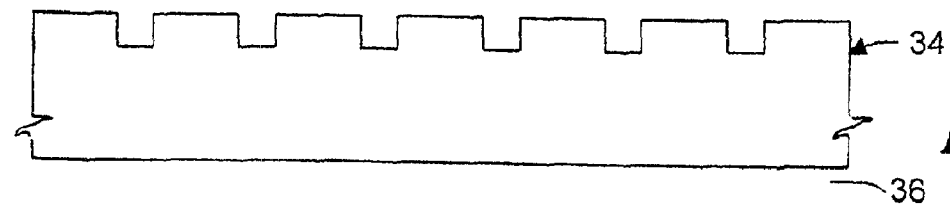
Figure 10:
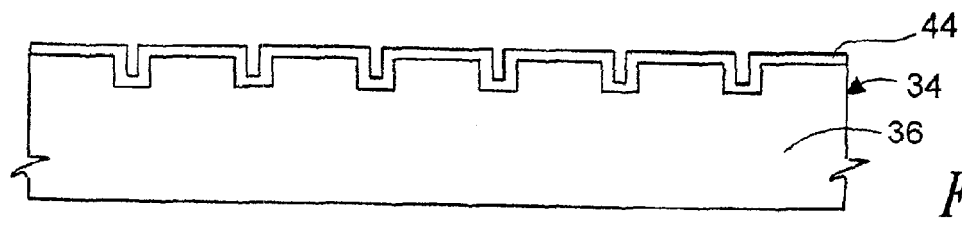

Alternatively, as schematically illustrated in FIGS. 8–10, the grating 38 could be realized without resorting to the deposition of the oxide layer 40, but rather by defining directly, with a chemical etch, the side face 34 of the supporting body 36 of the slider 32 using a mask reproducing the pattern of the grating 38, and then metallizing the supporting body 36 thus defined.

Figure 11:
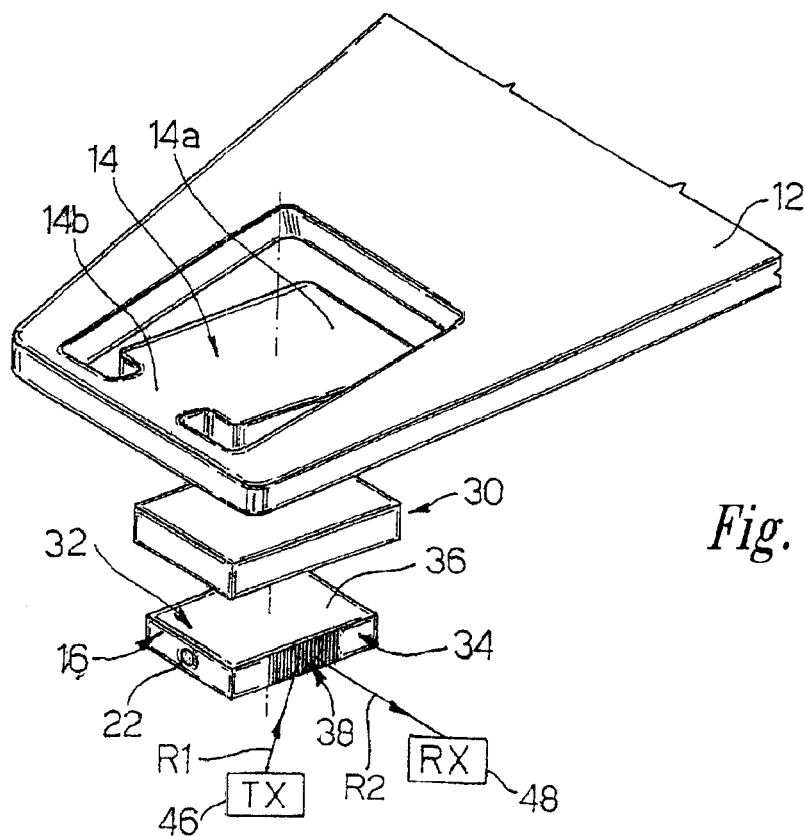
FIG. 11 shows a basic diagram for measuring the position of the slider in FIG. 4.

The determination of the position of the slider 32 with respect to the corresponding suspension 12 may therefore be carried out using the basic scheme illustrated in FIG. 11, that is using a laser transmitter 46, essentially composed of a laser light source, able to emit, and to direct towards the grating 38, a laser beam, indicated with R1, and a laser receiver 48, essentially composed of a suitably calibrated photodiode, arranged in such a way as to intercept the laser beam, indicated with R2, reflected by the grating 38 and outputting a position signal on the basis of which it is possible to calculate simply the position of the slider 32 with respect to the corresponding suspension 12 in an absolute Cartesian reference system external to the hard disk drive 1.

The choice of the metal material for metallizing used in the definition of the grating 38 depends on the wave length of the laser light beam used for measurement.

FIG. 12 shows a more detailed diagram of a measuring apparatus applicable to the spin-stand 26 for determining the position of the slider 32 with respect to the corresponding suspension 12 during the aforementioned initial operation of writing the control information in the pilot traces of the servo sectors of the hard disks 2.

As shown in FIG. 12, the measuring apparatus, designated as a whole by 50, comprises a laser light transmitting/receiving device 52 essentially formed by the aforementioned laser transmitter 46 and laser receiver 48; an optical fiber 54 optically coupled, at a first end 54*a*, to the laser light transmitting/receiving device 52 and passed through, in use, by the emitted laser beam R1 and by the reflected laser beam R2; a supporting structure 56, for example composed of an articulated arm, coupled to the output shaft 28 of the spin-stand 26 so as to be able to travel along a translation axis Z parallel to the oscillation axis B of the E-block 8 (orthogonal to the sheet) and onto which the second end 54*b* of the optical fiber 54 is fixed; an actuator 58, composed essentially of a electric step motor, coupled to the output shaft 28 of the spin-stand 26 and to the supporting structure 56 to move it along the translation axis Z; and a collimator 60 carried by the supporting structure 56 and optically coupled to the second end 54*b* of the optical fiber 54 with its own symmetry axis orthogonal to the grating 38 of the slider 32.

The determination of the position of the slider 32 with respect to the corresponding suspension 12 is carried out in the way described above with reference to FIG. 10 and the position of the slider 32 with respect to the corresponding suspension 12 which may be calculated with the measuring apparatus 50 in FIG. 11 is referred in a corresponding Cartesian reference system integral with the suspension 12.

In particular, it is stressed that the possibility of movement of the supporting structure 56 of the optical fiber 54 along the translation axis Z makes it possible to measure the position of all the sliders 32 (generally 6–8) of the hard disk drive 1 using the same laser light transmitting/receiving device 50.

From an examination of the characteristics of the slider 32 made according to the present invention the advantages that may be obtained with it are clear.

Firstly, the grating 38 may be formed on one of the side faces of the slider 32 in an extremely simple way during manufacturing of the slider 32 itself, as it requires only the definition of an oxide layer previously deposited on the side face of the slider 32 or the definition of the side face itself and its subsequent metallization.

Moreover, the definition of a grating 38 directly on one of the side faces of the slider 32 allows measurement of the position of the slider 32 with respect to the corresponding suspension 12 using optical apparatuses which, as is known, present extremely high precision suitable for the execution of initial operation of writing the control information in the pilot traces of the servo sectors of the hard disks 2 in high data storage density applications in which the distances between the traces of the hard disks are extremely reduced.

Moreover, being defined directly on one of the side faces of the slider 32 during the manufacturing process, the grating 38 does not constitute an added weight for the slider 32 and therefore it does not interfere in any way either with determining the characteristics of the slider 32, of the corresponding suspension 12 and of the corresponding microactuator 30 (which consists essentially of determining the system oscillation modes and, depending on these, of the system mechanical properties, such as the torsional stiffness) nor with the closed loop control of the position of the read/write head 22, contrary to what would occur on the other hand if macroscopic optical systems were used, such as lenses, prisms, etc., glued onto the slider 32, and which, due to the extremely light weight of the slider 32 (1.6 mg) would represent additional masses comparable with the weight of the slider 32 itself and would therefore make it more difficult to establish both the closed loop control of the position of the read/write head 22, and the characteristics of the slider 32, of the corresponding suspension 12 and of the corresponding microactuator 30.

Lastly it is clear that modifications and variations may be made to the grating 28, to the slider 32 and to the manufacturing process thereof herein described and illustrated without departing from the scope of the present invention, as defined in the enclosed claims.

For example, the grating 38 could be produced on the supporting body 36 of the slider 32 in positions different from the one described and illustrated, in particular on different faces from the one indicated.

Moreover, a grating 38 according to the present invention could also be used advantageously in hard disk drives with a single actuation stage in which the slider is glued onto the gimbal. In fact, the grating may be used on this type of hard disk drive both during the writing of the control information in the servo sectors to carry out a further measurement of the position of the slider 32 with respect to the suspension in addition to the one already carried out by the optical encoder of the spin-stand, and during the normal operation of the hard disk drive to determine with precision, at any time, the exact position of the slider 32 with respect to the corresponding suspension 12.

Moreover, when used in hard disk drives with a single actuation stage, the grating 38 could be provided on other parts of the hard disk drives apart from the slider 32, in particular it could be provided on the suspensions 12.

FIG. 13 shows one of the possible positions of the grating 38 on a suspension 12. In particular, the suspension 12 shown in FIG. 13 is of the type provided with so-called side rails, indicated with 62, and the grating 38 is positioned on the side rails 62.

Another possibility, not illustrated, could be that of providing the grating 38 on the gimbal 14; this positioning, however, is rather difficult to realize due to the small thickness of the gimbal 14 itself (a few tens of micron).

It should be noted that while this text makes reference to a read/write head, it is known in the industry that read only and write only heads may also be employed, and that, according to the principles of the invention, the exact nature of the transducer is not a limiting factor.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. Read/write transducer for a hard disk drive, comprising:
    a supporting body configured to be affixed to a microactuator so as to be movable with respect to an E-block of the hard disk drive;
    a read/write head carried by the supporting body; and
    an optically detectable structure coupled to the supporting body and structured to cooperate with optical measurement means to determine a position of the read/write head relative to the E-block.

2. Read/write transducer according to claim 1, wherein said optically detectable structure comprises a pattern of elements having different optical properties.

3. Read/write transducer according to claim 1, wherein said optically detectable structure comprises zones that reflect an incident electromagnetic radiation alternating with zones non-reflective to said incident electromagnetic radiation.

4. Read/write transducer according to claim 1, wherein said optically detectable structure comprises a succession of crests and depressions alternating with one another.

5. Read/write transducer according to claim 1, wherein said optically detectable structure comprises a grating.

6. Read/write transducer according to claim 1, wherein said optically detectable structure is carried by said supporting body.

7. Read/write transducer according to claim 6, wherein said optically detectable structure is integral with said supporting body.

8. Read/write transducer for a hard disk drive according to claim 1, further comprising at least one hard disk and at least one microactuator, said supporting body presenting a generally parallelepipedal shape with a bottom face turned towards said hard disk, an upper face coupled to said microactuator, and four side faces, wherein said optically detectable structure is arranged on one of said side faces of said supporting body.

9. A manufacturing process for manufacturing a read/write transducer for a hard disk drive, comprising the steps of:
providing a supporting body configured to be affixed to a microactuator coupled to an E-block of the hard disk drive;
applying a read/write head on said supporting body; and
providing, on the supporting body, an optically detectable structure configured to cooperate with optical measurement means for determining a position of the read/write head, relative to the E-block.

10. Manufacturing process according to claim 9, comprising:
providing at least one hard disk;
providing an E-block;
coupling a microactuator to the E-block for supporting and positioning said read/write transducer;
affixing the supporting body to the microactuator, said supporting body presenting a generally parallelepipedal shape with a bottom face turned towards said hard disk, an upper face coupled to said microactuator, and four side faces, wherein providing an optically detectable structure includes forming the optically detectable structure on one of said side faces of said supporting body.

11. Manufacturing process according to claim 9, wherein said step of providing an optically detectable structure comprises the step of forming, on the supporting body, a pattern of elements having different optical properties.

12. Manufacturing process according to claim 9, wherein said step of providing an optically detectable structure comprises the step of forming, on the supporting body, zones that reflect an incident electromagnetic radiation alternating with zones non-reflective to said incident electromagnetic radiation.

13. Manufacturing process according to claim 9 wherein said step of providing an optically detectable structure comprises the step of forming, on the supporting body, a succession of crests and depressions alternating with one another.

14. Manufacturing process according to claim 9, wherein said step of providing an optically detectable structure comprises the step of forming a grating on the supporting body.

15. Manufacturing process according to claim 14, wherein said step of forming a grating comprises the steps of:
depositing an oxide layer on a face of said supporting body;
defining said layer of oxide using a mask reproducing the pattern of said grating; and
metallizing the defined oxide layer.

16. Manufacturing process according to claim 14, wherein said step of forming a grating comprises the steps of:
defining a face of said supporting body using a mask reproducing the pattern of said grating; and
metallizing said defined face.

17. Hard disk drive comprising:
a hard disk;
a read/write transducer;
an E-block configured to selectably position the transducer relative to the hard disk;
means for supporting and moving said read/write transducer relative to the E-block; and
an optically detectable structure carried by either said read/write transducer or said supporting and moving means and configured to cooperate with optical measurement means.

18. Hard disk drive according to claim 17, wherein said optically detectable structure is a pattern of elements having different optical properties.

19. Hard disk drive according to claim 17, wherein said optically detectable structure is carried by said read/write transducer.

20. Hard disk drive according to claim 19, wherein said optically detectable structure is integral with said read/write transducer.

21. Hard disk drive according to claim 19 wherein said read/write transducer comprises a supporting body and a read/write head, said optically detectable structure being carried by said supporting body.

22. Hard disk drive according to claim 21, wherein said supporting body has a generally parallelepipedal shape with a bottom face turned towards said hard disk, an upper face coupled to said supporting and moving means, and four side faces, and wherein said optically detectable structure is arranged on one of said side faces of said supporting body.

23. Hard disk drive of claim 17 wherein the suppoting and positioning means is a microactuator.

24. Optical system for measuring the position of a read/write transducer for a hard disk drive comprising:
means for supporting and positioning said read/write transducer;
an optically detectable structure carried by either said read/write transducers or said supporting and positioning means; and
optical measurement means cooperating with said optically detectable structure for measuring the position of said read/write transducer relative to an E-block of said hard disk drive.

25. Optical measuring system according to claim 24, wherein said optically detectable structure is a pattern of elements having different optical properties.

26. Optical measuring system according to claim 24, wherein said optical measurement means comprise laser transmitter means designed to generate, and direct towards said optically detectable structure, a laser beam, and laser receiver means arranged in such a way as to intercept a laser beam reflected by said optically detectable structure.

27. Optical measuring system according to claim 26, wherein it comprises optical guide means having a first end optically coupled to said laser transmitter means and a second end supported to direct said laser beam towards said optically detectable structure and to intercept said laser beam reflected by said optically detectable structure.

28. Optical measuring system according to claim 27, further comprising a plurality of hard disks, wherein the supporting and positioning means is one of a plurality of means for supporting and positioning respective read/write transducers, wherein the optically detectable structure is one of a plurality of optically detectable structures, each carried by either one of said respective read/write transducers of one of said supporting and positioning means, and wherein the optical measuring system further comprises means for moving said second end of said optical guide means for placing it at one of said plurality of optically detectable structures.

29. Optical measuring system according to claim 24, wherein said optically detectable structure is carried by said read/write transducer.

30. Optical measuring system according to claim 29, wherein said optically detectable structure is integral with said read/write transducer.

31. A device comprising:
   a read/write transducer for a hard disk drive;
   a structure configured to move the transducer with respect to an E-block of the hard disk drive;
   an optically detectable structure coupled with the transducer;
   means for detecting light reflected by the optically detectable structure and or interpreting, from the reflected light, the position of the transducer relative to the hard disk drive.

32. The device of claim 31, wherein the optically detectable structure is a pattern of elements having different optical properties.

33. The device of claim 31, wherein the read/write transducer comprises a supporting body and a read/write head.

34. The device of claim 33, wherein the read/write head comprises a unitary body and the optically detectable structure is formed therein.

35. The device of claim 31 wherein the detection means includes means for interpreting, from the reflected light, the position of the transducer relative to the E-block.

36. A method, comprising:
   directing a light beam at an optically detectable structure coupled with a read/write transducer of the hard disk drive;
   detecting light reflected from the optically detectable structure; and
   determining the position of the transducer, relative to a suspension of the read/write transducer, by analysis of characteristics of the reflected light.

37. The method of claim 36, wherein the optically detectable structure is a pattern of elements having different optical characteristics.

38. The method of claim 36, further comprising determining the position of the transducer relative to the hard disk drive.

39. The method of claim 36, further comprising:
   direction an additional light beam at an additional optically detectable structure coupled with an additional read/write transducer of the hard disk drive;
   detecting light reflected from the additional optically detectable structure; and
   determining the position of the additional transducer, relative to a respective suspension, by analysis of characteristics of light reflected from the additional optically detectable structure.

40. A positioning device for determining a position of a read/write head of a disk drive, comprising:
   first locating means for locating, to a first, lower, degree of accuracy, a position of the read/write head relative to the hard disk drive; and
   second locating means for locating, to a second, higher, degree of accuracy, the position of the read/write head relative to the hard disk drive.

41. The device of claim 40 wherein the first locating means comprises a spin stand.

42. The device of claim 40 wherein the second locating means are configured to be movable in a first axis parallel to a second axis defined by positions of a plurality of read/write heads coupled to an E-block of the disk drive.

43. The device of claim 40 wherein the second locating means comprises a light source coupled to the first locating means and configured to direct light onto a support body of the read/write head.

44. The device of claim 43 wherein the light source comprises a laser.

45. The device of claim 43 wherein the second locating means comprises detecting means for detecting reflection, from the support body, of the directed light.

46. The device of claim 45 wherein the detecting means is configured to detect variations in character of light reflected from the support body.

47. The device of claim 40 wherein the first and second locating means are configured to cooperate with components of the disk drive to position the read/write head relative to a disk of the disk drive.

48. A device, comprising:
   an E-block configured to support a plurality of read/write heads associated with a disk drive and having a surface on an arm thereof; and
   a grating structure integrally formed on the E-block and including reflective regions and non-reflective regions defined on a surface of the E-block, the grating structure configured to provide varying characteristics of reflection of electromagnetic radiation according to an incident angle of the radiation with respect to the surface.

49. The device of claim 48 wherein the grating structure comprises regions of the surface having an oxide layer formed thereon.

50. The device of claim 48 wherein the grating structure comprises etched regions of the surface.

51. The device of claim 48 wherein the arm of the E-block comprises a suspension configured to support one of the plurality of read/write heads, and wherein the surface is formed on the suspension.

52. A device, comprising:
   a slider of a disk drive; and
   an optical grating formed as a unitary part of a body of the slider.

53. The device of claim 52 wherein the grating comprises alternating reflective and non reflective regions defined on the body.

* * * * *